(12) United States Patent
Mitra et al.

(10) Patent No.: US 10,546,079 B2
(45) Date of Patent: Jan. 28, 2020

(54) SYSTEM-LEVEL VALIDATION OF SYSTEMS-ON-A-CHIP (SOC)

(71) Applicants: The Board of Trustees of the Leland Stanford Junior University, Stanford, CA (US); The Board of Trustees of the University of Illinois, Urbana, IL (US)

(72) Inventors: Subhasish Mitra, Palo Alto, CA (US); Keith Campbell, Urbana, IL (US); David Lin, Palo Alto, CA (US); Deming Chen, Urbana, IL (US)

(73) Assignees: The Board of Trustees of the Leland Stanford Junior University, Stanford, CA (US); The Board of Trustees of the University of Illinois, Urbana, IL (US)

( * ) Notice: Subject to any disclaimer, the term of this patent is extended or adjusted under 35 U.S.C. 154(b) by 12 days.

(21) Appl. No.: 15/579,577

(22) PCT Filed: Jun. 6, 2016

(86) PCT No.: PCT/US2016/035963
§ 371 (c)(1),
(2) Date: Dec. 4, 2017

(87) PCT Pub. No.: WO2016/200718
PCT Pub. Date: Dec. 15, 2016

(65) Prior Publication Data
US 2018/0165393 A1 Jun. 14, 2018

Related U.S. Application Data

(60) Provisional application No. 62/172,092, filed on Jun. 6, 2015.

(51) Int. Cl.
*G06F 17/50* (2006.01)
*G06F 11/36* (2006.01)

(52) U.S. Cl.
CPC ...... *G06F 17/5022* (2013.01); *G06F 11/3648* (2013.01)

(58) Field of Classification Search
CPC .................. G06F 17/5022; G06F 11/3648
(Continued)

(56) References Cited

U.S. PATENT DOCUMENTS

| | | | |
|---|---|---|---|
| 5,331,568 A | * | 7/1994 | Pixley ............... G06F 17/504 |
| | | | 716/107 |
| 6,487,699 B1 | | 11/2002 | Devins et al. |

(Continued)

FOREIGN PATENT DOCUMENTS

| | | |
|---|---|---|
| CN | 101720464 A | 6/2010 |
| CN | 102841837 A | 12/2012 |
| CN | 103150441 A | 6/2013 |

OTHER PUBLICATIONS

Authorized Officer: Shane Thomas, "Written Opinion" issued in counterpart PCT application No. PCT/US16/35963, dated Sep. 8, 2016.

(Continued)

*Primary Examiner* — Suchin Parihar
(74) *Attorney, Agent, or Firm* — Kaplan Breyer Schwarz, LLP

(57) ABSTRACT

Disclosed are improved methods and structures for verifying integrated circuits and in particular systems-on-a-chip constructed therefrom. Our methods—which we call Quick Error Detection—Hardware (QED-H)—advantageously quickly detect and fix anomalies (bugs) within SoC hardware components—and in particular customized SoC hardware components that are not necessarily software program- (Continued)

mable. Of further advantage, methods according to the present disclosure are compatible with existing Quick Error Detection (QED) techniques while being extensible to target software-programmable components as well. In sharp contrast to prior art methods, method(s) according to the present disclosure represent a new system validation methodology that builds validation checks in both software and hardware components seamlessly and systematically, thus enabling extremely quick error detection and localization for all digital components of the entire SoC advantageously producing productivity and time-to-market gains.

10 Claims, 12 Drawing Sheets

(58) Field of Classification Search
USPC .......................................................... 716/106
See application file for complete search history.

(56) References Cited

U.S. PATENT DOCUMENTS

| | | |
|---|---|---|
| 7,111,217 B1 | 9/2006 | Schultz |
| 7,827,510 B1 | 11/2010 | Schubert et al. |
| 9,928,150 B2 * | 3/2018 | Lin ..................... G06F 11/2236 |
| 2002/0087931 A1 | 7/2002 | Jaber |
| 2003/0163764 A1 | 8/2003 | Williams et al. |
| 2007/0168768 A1 * | 7/2007 | Galbi .................. G06F 11/1032 714/701 |
| 2007/0300131 A1 | 12/2007 | Chu |
| 2009/0100304 A1 | 4/2009 | Li et al. |
| 2018/0157574 A1 * | 6/2018 | Mitra .................. G06F 11/3003 |
| 2019/0013930 A1 * | 1/2019 | Munir .................. H04L 9/0631 |

OTHER PUBLICATIONS

Authorized Officer: Shane Thomas, "International Search Report" issued in counterpart PCT application No. PCT/US16/35963, dated Sep. 8, 2016.

Lin David et al: "Quick error detection tests with fast runtimes for effective post-silicon validation and debug", 2015 Design, Automation & Test in Europe Conference & Exhibition (Date), EDAA, Mar. 9, 2015 (Mar. 9, 2015), pp. 1168-1173.

"Office Action" issued in related European Patent Application No. 16808076, dated May 23, 2018, 08 pages.

Office Action issued in counterpart Chinese patent application No. 201680032730.7, dated Oct. 11, 2019, 22 pp.

* cited by examiner

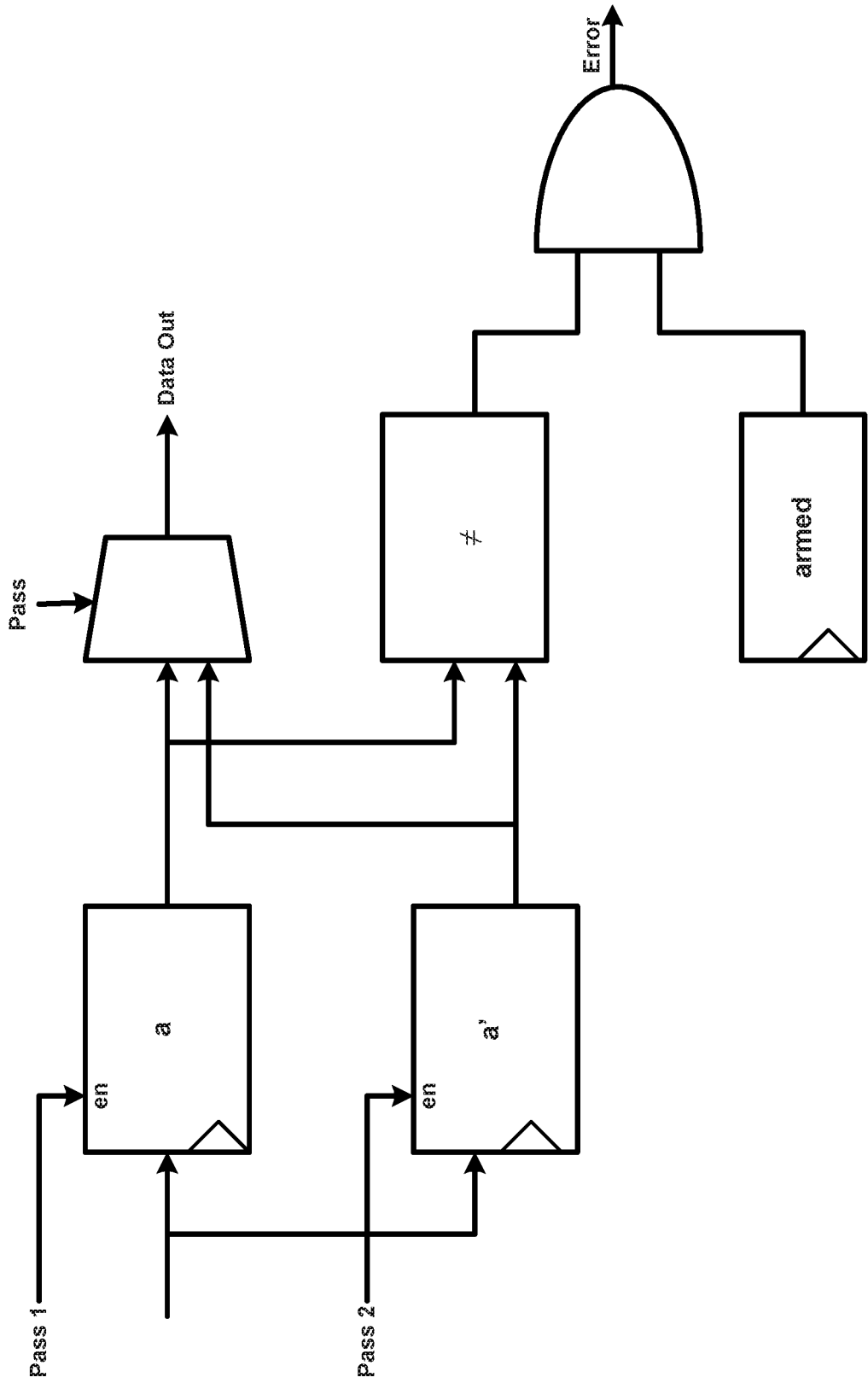

SYSTEM-LEVEL VALIDATION OF SYSTEMS-ON-A-CHIP (SOC)

CROSS REFERENCE TO RELATED APPLICATION

This application claims the benefit of U.S. Provisional Application Ser. No. 62/172,092 filed 6 Jun. 2015.

TECHNICAL FIELD

This disclosure relates generally to integrated circuits and more particularly to methods and structures for the effective system-level validation of systems-on-a-chip.

BACKGROUND

As will be readily appreciated by those skilled in the art, the functionality and ubiquity of integrated circuits and systems constructed thereon has progressed at a breathtaking pace. Consequently, such circuits and systems have had a profound impact on contemporary society.

Given their importance, methods and structures for the verification of these circuits and systems would represent a welcome addition to the art.

SUMMARY

An advance in the art is made according to an aspect of the present disclosure directed to improved methods and structures for verifying integrated circuits and in particular systems-on-a-chip constructed therefrom. Our methods according to the present disclosure—which we call Quick Error Detection—Hardware (QED-H)—advantageously and quickly detect and fix anomalies (bugs) within SoC hardware components—and in particular customized SoC hardware components that are not necessarily software programmable. Of further advantage, methods according to the present disclosure are compatible with existing Quick Error Detection (QED) techniques while being extensible to target software-programmable components as well.

More specifically, methods according to the present disclosure provide a computer implemented method for system-level validation of a digital hardware system which generates a high-level description of the digital hardware system; embeds into the high level description a number of quick error detection (QED) transformations; generates from the high-level description an executable software program representative of operation of the digital system; generates the digital hardware system from the high-level description including the QED transformations; executes, on a processor, the executable software program wherein upon execution one or more software signatures are generated; operates the generated digital hardware system wherein upon operation one or more hardware signatures are generated; and compares the software signatures to the hardware signatures and in response to the comparison, providing an output indicative of that comparison which in turn is indicative of correct operation of the system. Of particular advantage, the computer implemented method is applicable to System on a Chip (SoC) digital systems. Of further advantage, the software execution and the hardware operation need not take place simultaneously nor in lock-step. Finally, the digital system so validated need not itself be software programmable.

In sharp contrast to prior art methods, method(s) according to the present disclosure represent a new system validation methodology that is applicable at all stages of development—including pre-silicon—builds validation checks in both software and hardware components seamlessly and systematically, thus enabling extremely quick error detection and localization for all digital components of the entire SoC—advantageously producing improved performance of both the debugging and the resulting systems along with significant productivity and time-to-market gains.

BRIEF DESCRIPTION OF THE DRAWING

A more complete understanding of the present disclosure may be realized by reference to the accompanying drawing in which:

FIG. 2(A) shows a schematic diagram depicting illustrative register transforms for TR-QH employing a duplicated register according to an aspect of the present disclosure;

DETAILED DESCRIPTION

Figure 1:
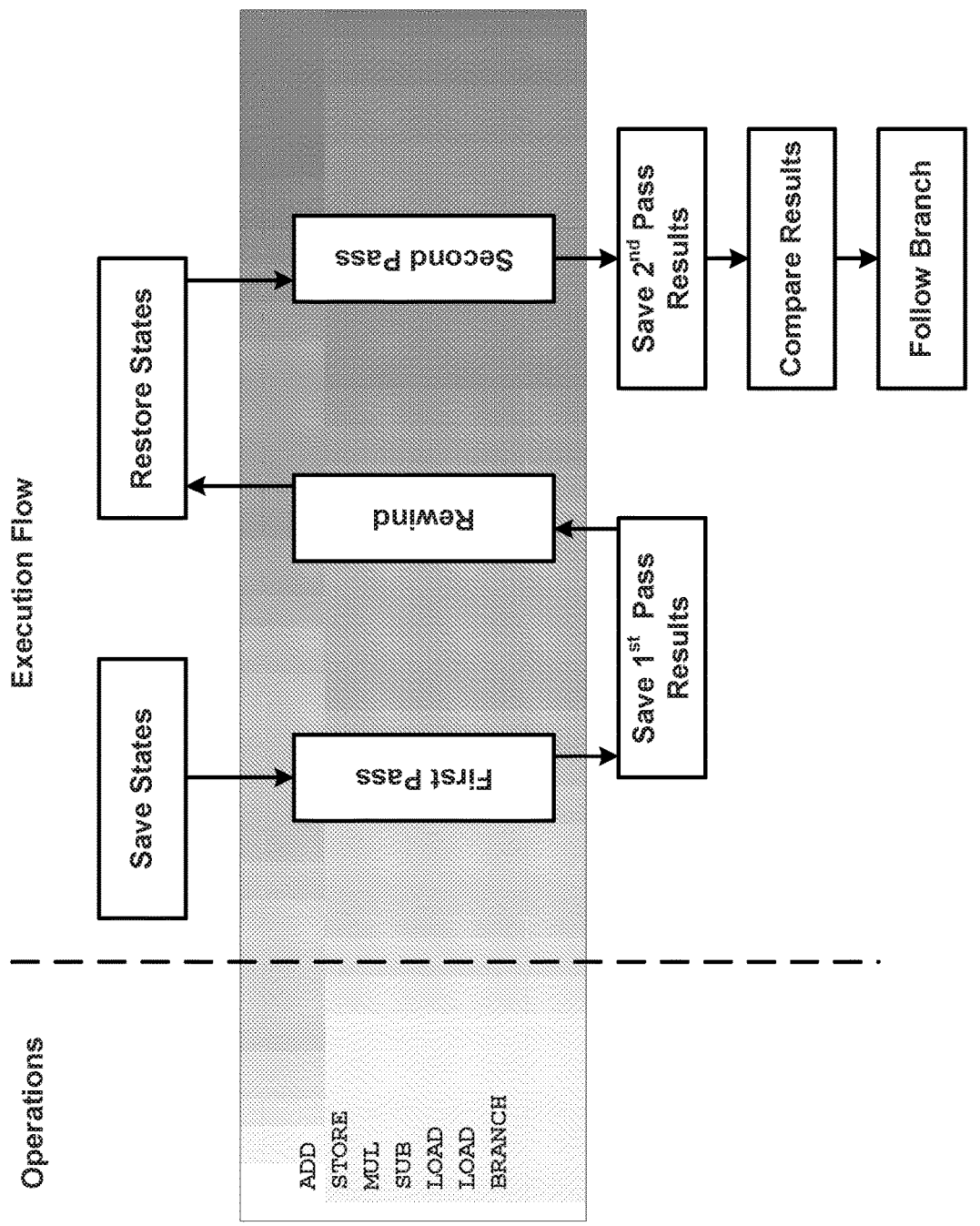
FIG. 1 shows a schematic diagram depicting an illustrative Time Redundant QED-H (TR-QH) execution according to an aspect of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope. More particularly, while numerous specific details are set forth, it is understood that embodiments of the disclosure may be practiced without these specific details and in other instances, well-known circuits, structures and techniques have not been shown in order not to obscure the understanding of this disclosure.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the disclosure.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

Glossary

The following Glossary includes definitions provided to assist in further understanding the disclosure.

Quick Error Detection (QED)—a technique involving the transformation of existing post-silicon validation test(s) into new validation tests that reduce error detection latency. QED transformations allow flexible tradeoffs between error detection latency, coverage, and complexity and may be implemented in software with little or no hardware changes.

Bug—an error, flaw, failure, or fault in a computer program or system that causes or otherwise contributes to it producing an incorrect or unexpected result or to behave in unintended ways.

Electrical Bugs—are a type of bug that only manifests itself under specific operating conditions (voltage, frequency, temperature, etc.) and may be caused by design marginalities, synchronization problems, noise, etc.

System on a Chip (SoC) is an integrated circuit (IC) that integrates all components of a system into/onto a single chip or integrated package of chips. It may contain digital, analog, mixed-signal, and radio frequency functions. SoC may also refer to technology(ies) that package or otherwise integrate all parts for a system on a single integrated circuit.

Signature is a characteristic of an operating instance of a digital system or a software program representative of the digital system.

The following merely illustrates the principles of the disclosure. It will thus be appreciated that those skilled in the art will be able to devise various arrangements which, although not explicitly described or shown herein, embody the principles of the disclosure and are included within its spirit and scope. More particularly, while numerous specific details are set forth, it is understood that embodiments of the disclosure may be practiced without these specific details and in other instances, well-known circuits, structures and techniques have not be shown in order not to obscure the understanding of this disclosure.

By way of some additional background, we begin by noting that improvements in integrated circuits and in particular system-on-a-chip (SoC) designs are oftentimes accompanied by an increase in complexity. Without scalable ways of managing and/or mitigating such complexity and verifying correct operation, future systems may be vulnerable to logic and electrical bugs that could possibly compromise correct circuit and/or system operation.

Unfortunately, traditional, prior-art pre-silicon verification techniques alone are inadequate for verifying correct operation of contemporary systems-on-a-chip. As will be appreciated by those skilled in the art, such traditional techniques are generally too slow and do not adequately address electrical bugs. Consequently, there is growing reliance by those skilled in the art on system-level validation (i.e., emulation) and post-silicon validation (PSV) techniques.

Recently, a new technique—Quick Error Detection (QED)—has been shown to be highly effective for post-silicon validation of programmable components in SoCs. Operationally, QED transforms software programs such that bugs in a software-programmable component can be quickly detected. Unfortunately, QED does not work for certain hardware structures oftentimes included as part of an SoC such as high-definition video accelerators and power management circuitry—among others.

Accordingly, aspects of the present disclosure are directed to a set of new system validation methodologies we call QED-H (QED for Hardware), which advantageously detect and fix bugs within SoC hardware components—including those that are not software programmable. Of further advantage, QED-H is compatible with existing QED techniques and can therefore be extended into software-programmable components as well.

Advantageously, QED-H utilizes rapid advances in high-level synthesis (HLS). Through HLS optimizations, QED-H transformations are naturally and seamlessly embedded into a high-level description of a hardware design and a corresponding RTL design is automatically generated, fulfilling our PSV objectives while effectively controlling area/power/performance overheads to the minimum. Meanwhile, we achieve the signature benefit of HLS: dramatically improving design productivity along the way. Importantly, QED-H may be applied to any digital system and may start with high-level descriptions including those in C++, C#, JAVA, VERILOG, etc. Even further, QED-H is applicable to pre-silicon verification even in those instances where inputs are RTL code or written in languages such as Verilog or VHDL.

At this point, it is worth noting several characteristics of QED-H including the following:

Ultra-short Error Detection Latency

Error detection latency is a measure of the time elapsed from when an error is induced by a bug to when it is detected. Since the potential "cone of influence" and therefore the number of potential sources of an error generally increase exponentially as the error detection latency increases, low error detection latency is necessary to effectively reduce the time and effort associated with bug localization. As will be readily appreciated by those skilled in the art, bugs having error detection latencies longer than a few thousand clock cycles say, are highly challenging to localize since it is extremely difficult to trace such a long cycle history. As we now note and will describe later—for particular hardware components in a SoC—error detection latencies that range up to several million clock cycles are commonly experienced without employing QED-H, while a median detection latency of <100 clock cycles is experienced when QED-H is employed.

Minimal Intrusiveness

QED-H advantageously ensures that bugs continue to be detected after the introduction of QED-H.

High Diversity

QED-H advantageously leverages an implicit redundancy by reusing existing hardware to detect errors induced by design bugs. Higher degrees of "diversity" between implicitly redundant checking paths improve bug coverage as well as quick detection of errors induced by bugs.

Low Area/Delay Overhead

While QED-H does impose certain area and/or performance costs, advantageously QED-H is comparatively modest in such costs. More specifically, QED-H imposes an area cost of less than 3% and negligible performance overhead relative to an original design after fabrication.

To instrument QED-H in conjunction with high-level synthesis, we employ two complementary approaches that we call: 1) Time Redundancy QED-H (TR-QH) and 2) Hybrid QED-H (H-QH). As we will show, each approach offers tradeoffs with respect to certain characteristics such as error detection latency, intrusiveness, diversity, and overhead.

More specifically, TR-QH detects errors error by redundantly executing sequences of operations including checks and comparing the executions. We note that since hardware is reused for all of the executions, TR-QH is not a modular redundancy technique. Advantageously, TR-QH exhibits low detection latency, moderate intrusiveness, moderate to high diversity, and moderate overhead.

H-QH detects errors by redundant execution of an accelerator through high-level software emulation of the same functionality as the accelerator on an existing on-chip processor. H-QH has moderate detection latency, low intrusiveness, high diversity, and very low overhead.

In outlining our methodology objectives, we note first that control of area/power/performance overhead is one priority for our approaches. Second, we also prioritized the quick detection of bug-induced errors (i.e., low error detection latency), which—as may be readily appreciated by those skilled in the art—is essential for effective bug localization. Third, we prioritized high error coverage through minimal intrusiveness and maximized diversity. Advantageously, these prioritized objectives are realized through our new Post-Silicon Validation (PSV)-centric High Level Synthesis (HLS) engine together with specially designed auxiliary logic and memory components. As we shall observe, while QED-H does introduce some test execution overhead (e.g., redundant execution time during PSV) it is noted that when one generally performs system validation, it is debug time rather than test execution time that dominates the overall time "cost". Therefore, some test execution time overhead may be tolerated if error detection latency is significantly reduced.

Time Redundant QED-H

According to an aspect of the present disclosure, Time Redundant QED-H (TR-QH) is a transformation that modifies a state machine of a circuit to re-execute each single-entry-point, single-exit-point region (e.g. basic block) of code. Operationally, such a transformation is embedded in a high-level description of a system design using C/C++/SystemC or other suitable languages. This transformed high-level description of the design is then applied as to an HLS engine to automatically produce register transfer logic (RTL) automatically.

Turning now to FIG. 1, there is shown a schematic diagram depicting conceptual TR-QH execution. As may he understood, according to the present disclosure each region execution is transformed into a set of steps as schematically illustrated in FIG. 1. More specifically, it may be observed that for a set of operations such as those shown (ADD, STORE, MUL, SUB, LOAD, LOAD, BRANCH) the execution(s) that occur include saving states prior to a first pass, saving the first pass results, rewinding back to the beginning and restoring the saved states prior to the second pass, saving the second pass results, and comparing the results of the first and second pass.

Notably, if implemented naively, the process outlined in FIG. 1 may exhibit a high area and performance overhead. As may be readily appreciated by those skilled in the art, one objective of HLS for TR-QH is a significant PSV benefit with very low area and performance overhead. Accordingly, we have identified two requirements for the above steps to achieve a satisfactory TR-QH implementation namely:

TR-QH (1): variables representing inputs to a region that are modified in that region are saved and restored for re-execution. This represents a read-before-write hazard in the time-redundant execution.

TR-QH (2): variables representing outputs of a region are saved in the first pass for comparison with the second pass.

Figure 2B:
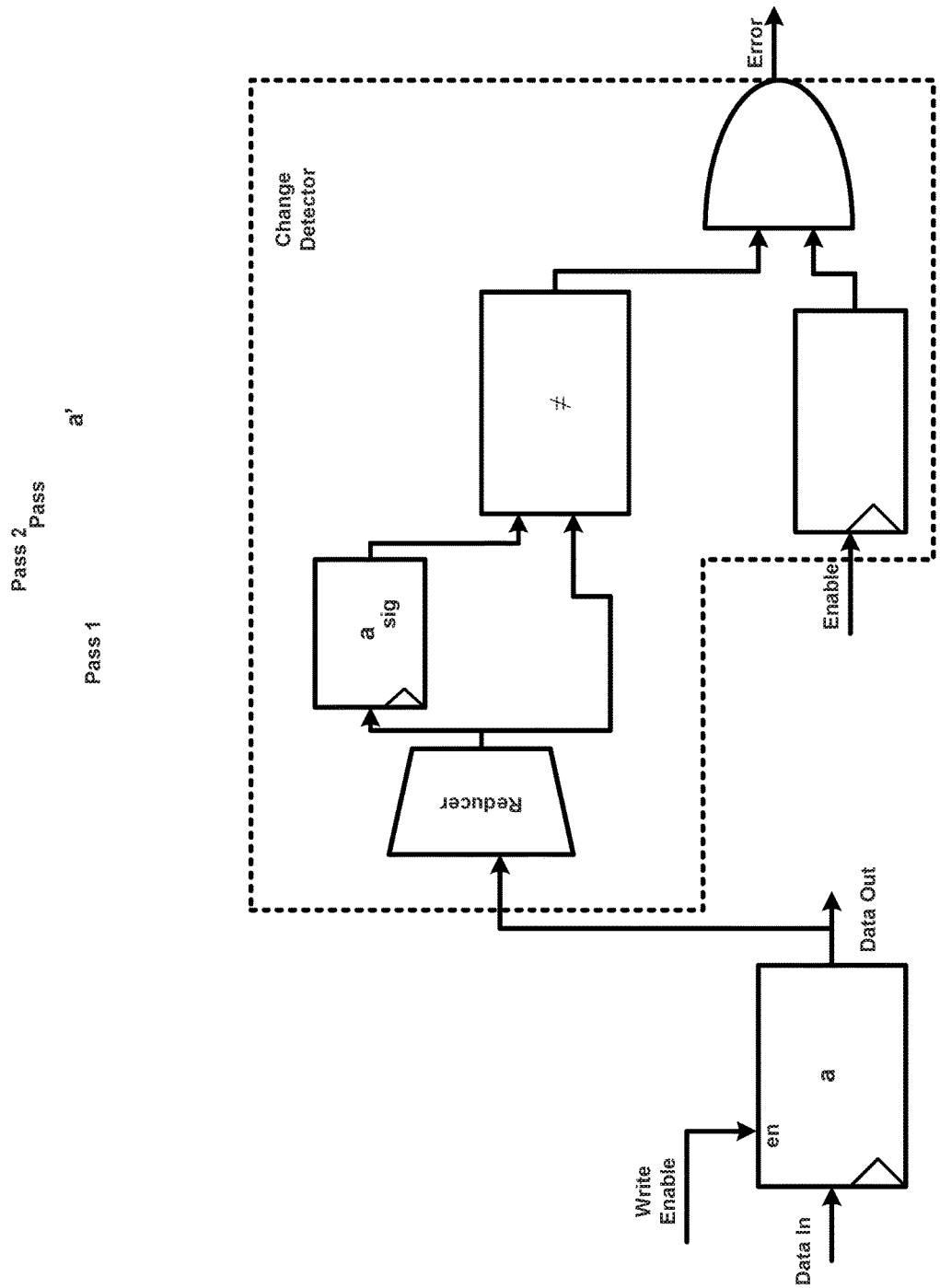
FIG. 2(B) shows a schematic diagram depicting illustrative register transforms for TR-QH employing a register with change detector according to an aspect of the present disclosure.

Turning now to FIGS. 2(A) and 2(B), there is shown in schematic form two illustrative techniques for register transforms according to an aspect of the present disclosure. More specifically, FIG. 2(A) shows a duplicated register technique while FIG. 2(B) shows a register with change detector technique.

With reference now to FIG. 2(A), it may be observed that the technique depicted therein according to the present disclosure is one of register duplication, namely using a first register (i.e., register a in FIG. 2(A) in the first pass and a second register (i.e., register a' in FIG. 2(A) in the second pass. After completion, result(s) of the two passes are compared through the effect of a dedicated comparator connected to the register outputs.

As may be appreciated, "Saving" is performed upon entry into a region with the second register that was previously verified to match the first. "Restoring" is simply a matter of switching the multiplexor to read from the second saved register. If a register is not read before being written into a region, then TR-QH (1) no longer applies.

Notably, we can collapse the duplicated register into one register with a low-area change detector, as illustrated in FIG. 2(B). The result is a low-overhead circuit that detects changes in the original register with low aliasing probability. We satisfy TR-QH (2) with a chain of comparisons of the current register value with the next extending from the write in the first pass to the same write in the second pass. If each comparison result is "equal", then we transitively prove that the first and second writes match, Advantageously, these specially PSV-tailored hardware(s) are then seamlessly embedded into our HLS engine such that hardware that is both optimized for area/power/performance and PSV is produced—thereby leading to significant productivity and time-to-market gains.

Preliminary Results

To evaluate the quality of TR-QH in terms of error coverage and detection latency, we have implemented it through a high-level synthesis (HLS) flow based on the Low Level Virtual Machine (LLVM) compiler framework. We chose the basic block as the region granularity, used change detecting registers and duplicated registers for all regions' register outputs, and a QED-H cache (introduced later) inserted into the memory controller to check memory outputs. We evaluated coverage by injecting transient errors into randomly selected live flip-flops at random cycles in the execution of each HLS core. The results for the JPEG benchmark are shown graphically in FIG. 3.

Figure 3:
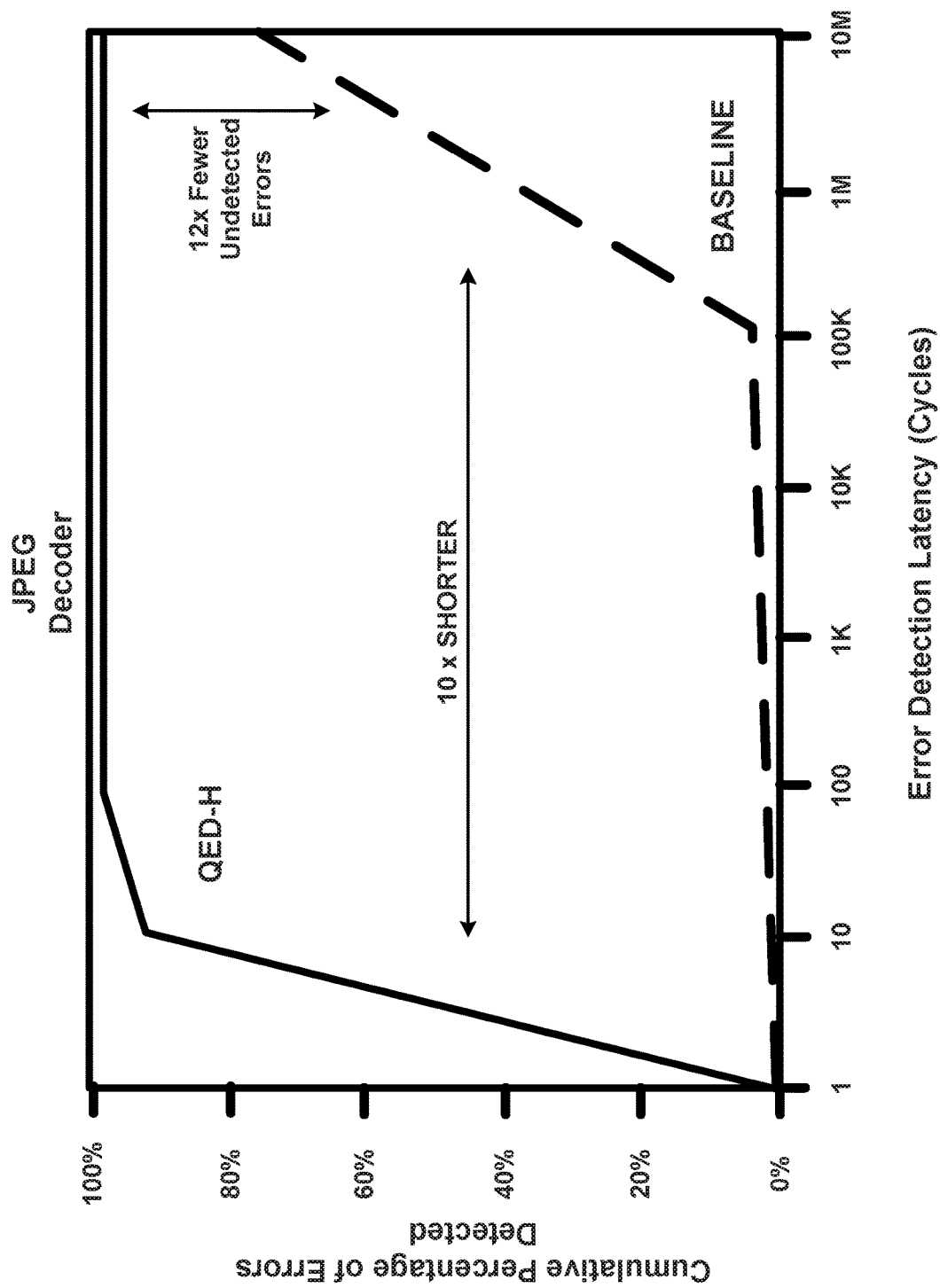
FIG. 3 shows a graph showing error detection for benchmark JPEG with TR-QH vs. baseline design without TR-QH.

As may be understood with reference to that FIG. 3, TR-QH improves error detection latencies by five orders of magnitudes (within 10 clock cycles for 92.4% of the errors while the baseline would take hundreds of thousands or millions of cycles to detect errors). Also, TR-QH results in 12-fold fewer undetected errors (2.2% vs. 25.4% undetected errors of baseline). The QED-H area overhead for this design is 3.1% due to register duplication and QED-H cache and the clock period overhead is 4.4%.

Diverse Scheduling and Binding for TR-QH

Figure 4A:
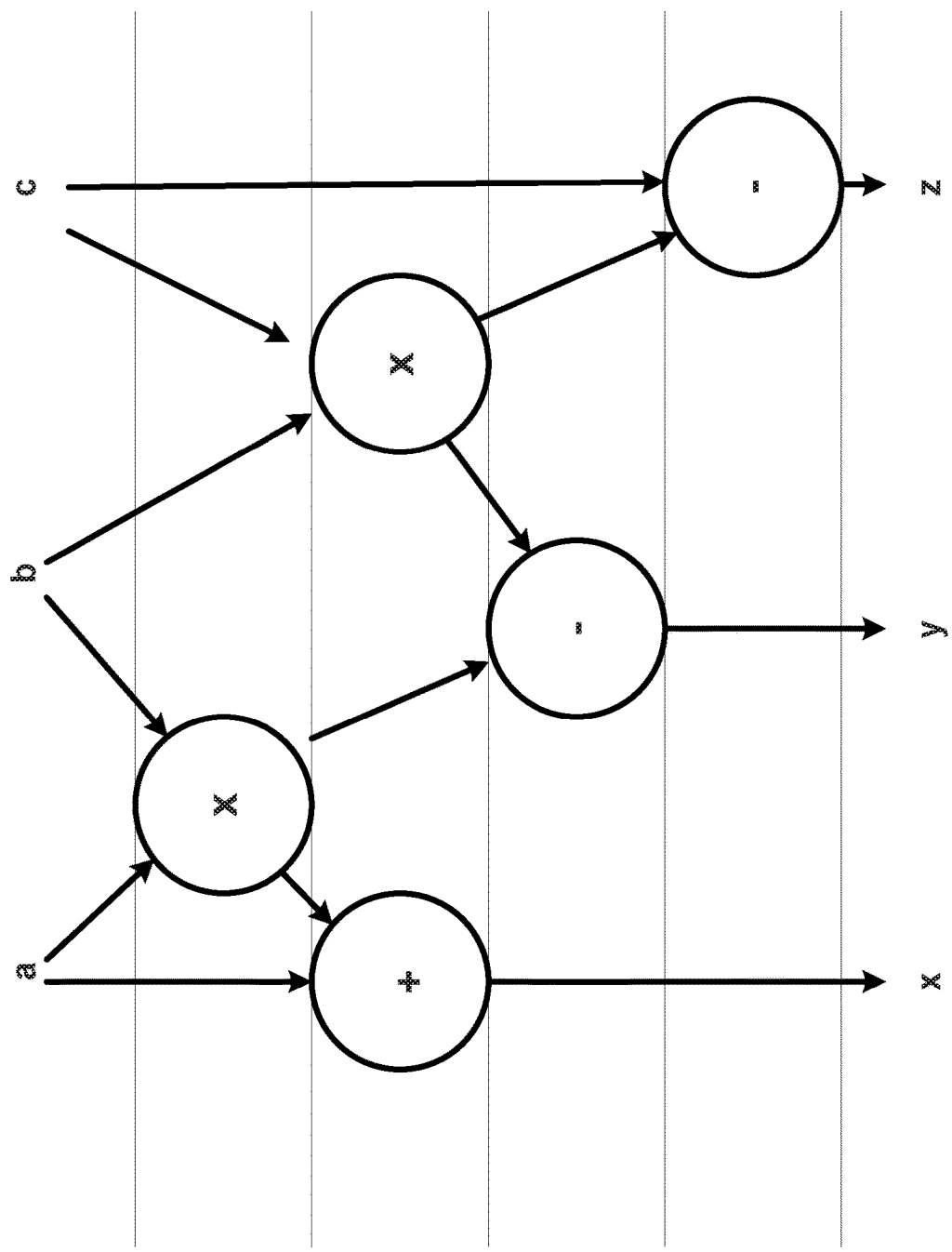
FIGS. 4(A)-4(B) show a schematic diagram of two highly diverse schedules for an illustrative computation wherein Schedule B is a re-execution of Schedule A but with a different execution order.
Figure 4B:
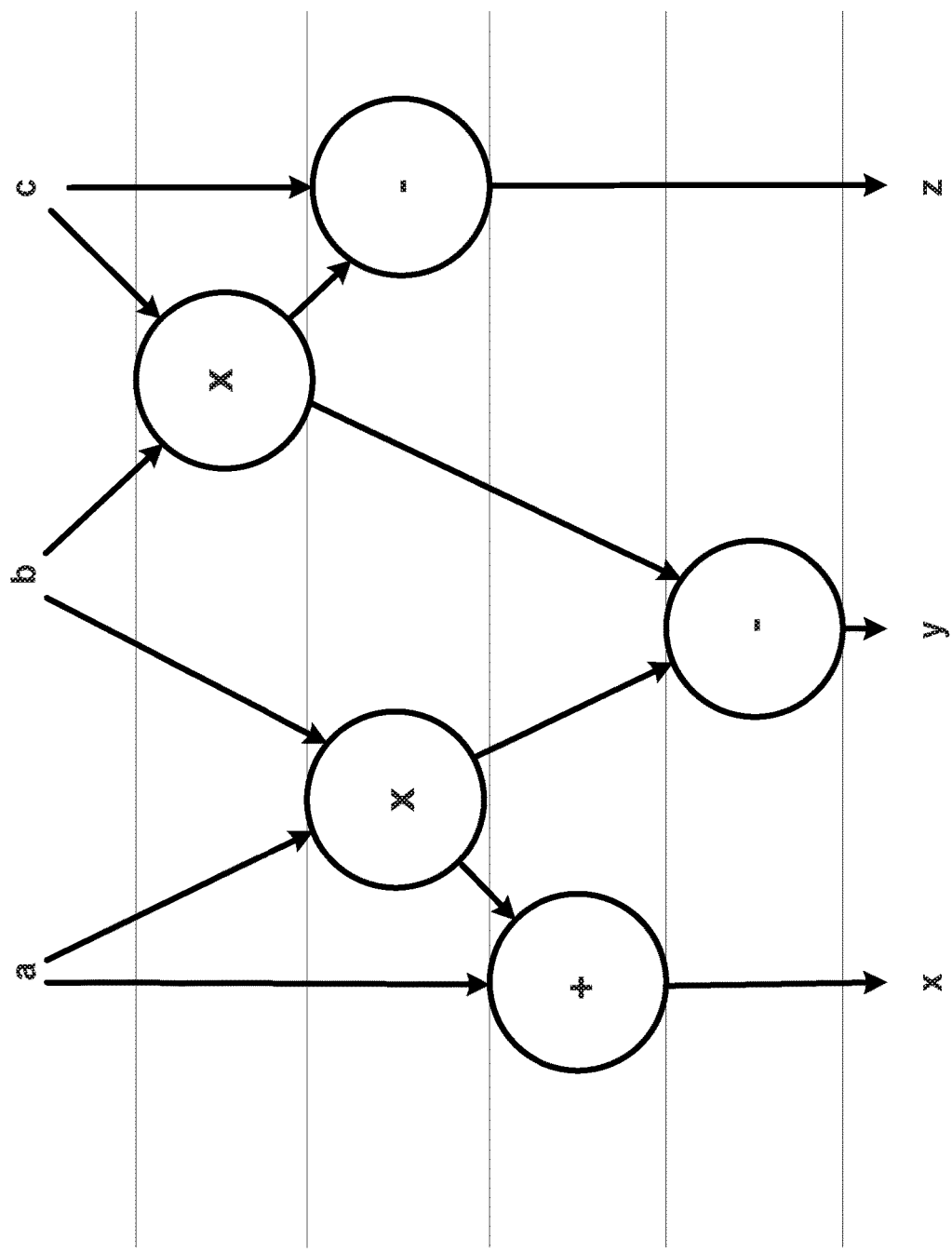

For increased diversity, we can advantageously modify a schedule of the second pass so that not only are both passes executed in different times, but some operations in the second pass are executed in different cycles than in the first as illustrated in FIGS. 4(A) and 4(B).

With reference to those FIGS. 4(A) and 4(B) there is shown two diverse schedules for an example computation. More specifically, FIG. 4(A) depicts a Schedule A and FIG. 4(B) depicts a Schedule B. As depicted therein, Schedule B is a re-execution of Schedule A but with a different execution order.

At this point it is notable that we can add hardware diversity by using different hardware resources for some operations in the first and second pass. This additional hardware diversity comes with a cost of some increased intrusiveness, as well as some additional area cost for wider/more multiplexors (MUX).

Of further note is the addition of a binding aware rescheduler that examines an original binding solution and constructs an alternative schedule that reuses as much of the original hardware resources as possible, namely: flops, FUs, and wires while maximizing diversity.

Hybrid QED-H

Hybrid QED-H (H-QH) comprises two parts:

The accelerator will be automatically generated through a different HLS flow that takes the accelerator specification in a high-level description language. However, this generated accelerator does not contain special hardware components such as that described previously with respect to FIG. 2. The only requirement that is related to PSV is that this new HLS engine would modify the accelerator to output state and data history signatures at regular intervals.

The same high-level description for the accelerator will be compiled as software and executed in a processor that already exists on the SoC, which would produce the same set of signatures and compare them with the hardware output to identify the first discrepancy.

H-QH Transforms

Figure 5:
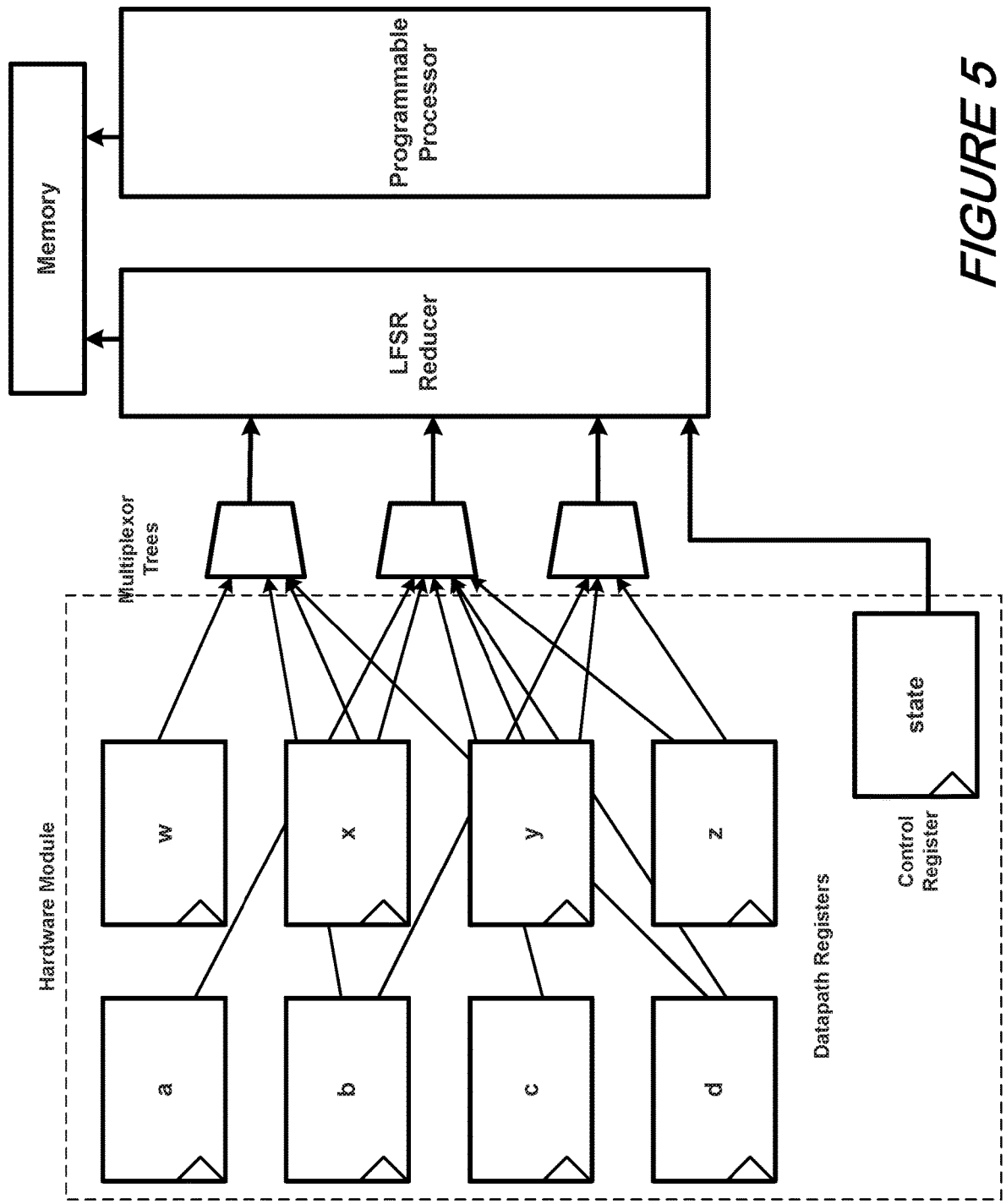
FIG. 5 shows a schematic diagram of illustrative signature extracting components inserted by a QED-H transform according to an aspect of the present disclosure.

With reference now to FIG. 5, there is shown a schematic of signature extracting components inserted by the QED-H transform according to an aspect of the present disclosure. Operationally, we connect each "non-temporary" register to one or more MUX trees such that no two registers are (dynamically) connected to the same tree when they are written in the same state. Thus the number of MUX trees must be at least the maximum number of simultaneous non-temporary register writes occurring in a state. Advantageously, the trees reduce the number of data bits to a small number (e.g., 128 bits), which can then be passed, along with the control state register, to linear feedback shift register (LFSR) for further reduction.

The signature contained within the LFSR is then written to a log in memory at a regular interval. We will use LLVM intermediate representation (LLVM-IR) in this approach. The LLVM infrastructure comes with a just-in-time (JIT) compilation engine that enables CPU-native speed execution of LLVM-IR, resulting in fast, but also high-fidelity emulation of the hardware since each LLVM-IR instruction corresponds closely with the hardware registers and functional units that execute in the accelerator module.

Detecting Memory Errors Induced by Bugs

For both TR-QH and H-QH, one way to detect bug-induced memory errors is by conceptually duplicating memory used by a core. As may be readily appreciated by those skilled in the art, physical duplication of memory would incur unacceptable area overhead, so in practice we implement duplication by splitting the memory space allocated for the accelerator into two equal-sized partitions. One memory partition would be used for one execution, and the other memory partition would be used for the redundant (or second) execution. Advantageously, we take a two-pronged approach to detecting memory errors: checking data going in and out of memory with load and store checks, and detecting silent memory corruption with proactive scrubbing.

For both TR-QH and H-QH, we consider stores to be region outputs that need to be checked. In TR-QH, we modify the memory controller to add support for a check operation that verifies that a second redundant write matches a first one by issuing a load operation and comparing with input data. In H-QH, we include each store address and data in the signature computation.

Unfortunately, however, such checks may not be sufficient to detect errors in the memory controller or memory blocks themselves. For example, a broken memory block may "clobber" adjacent memory locations when a store is issued. Waiting for a load from such memory locations to detect the error may take too long, resulting in high error detection latency.

To overcome this problem, we implement a memory scrubber that performs proactive load and check (PLC) by opportunistically performing loads from identical locations in both the original and duplicate partitions and checking whether they match. PLC may not work effectively in high memory traffic, which means we may need to stall the accelerator in order to obtain reasonable error detection latency. We will explore this intrusiveness-latency tradeoff.

In certain situations, there is insufficient memory to split the memory space. For example, an accelerator may have limited local memory buffers. To avoid physical duplication of the memory buffers for TR-QH, we can use a QED-H Cache, whose operation is illustrated in FIG. 6.

Figure 6:
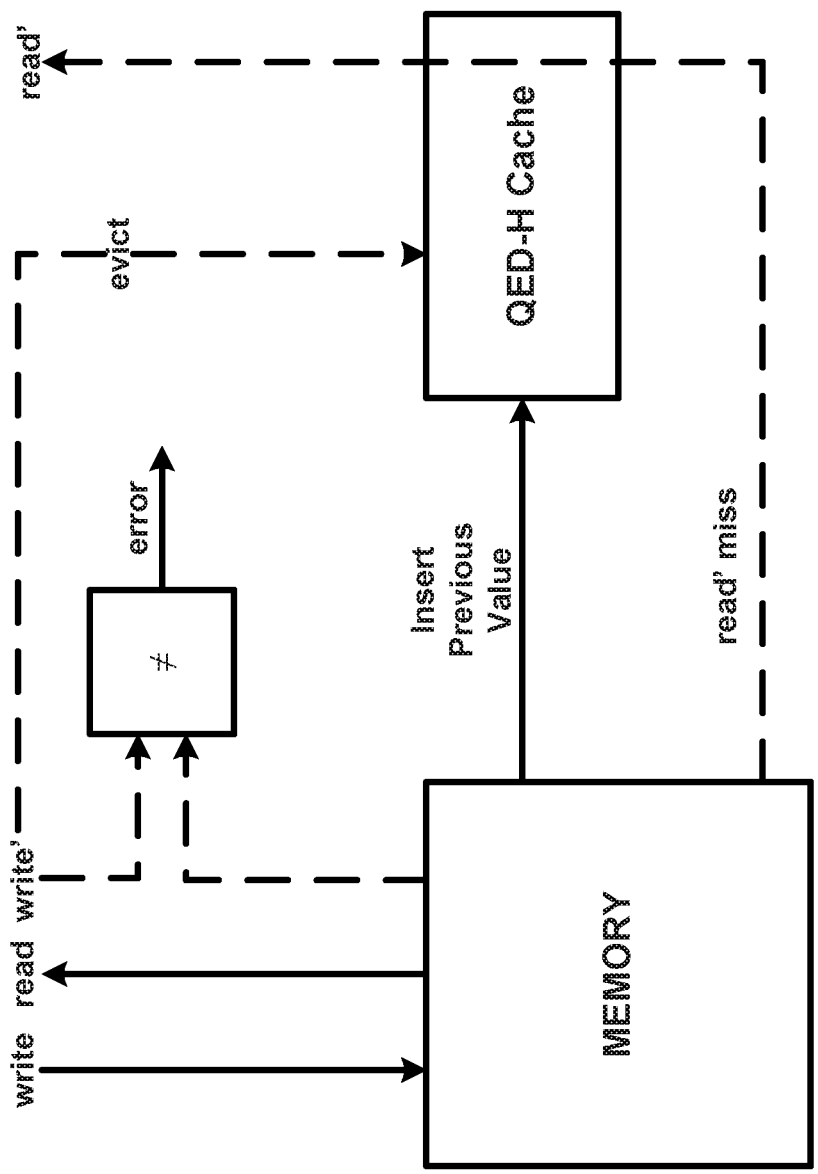
FIG. 6 shows a schematic diagram of illustrative QED-H cache operation(s) according to an aspect of the present disclosure wherein solid lines correspond to a first past while dotted lines correspond to a second pass.
Figure 7:
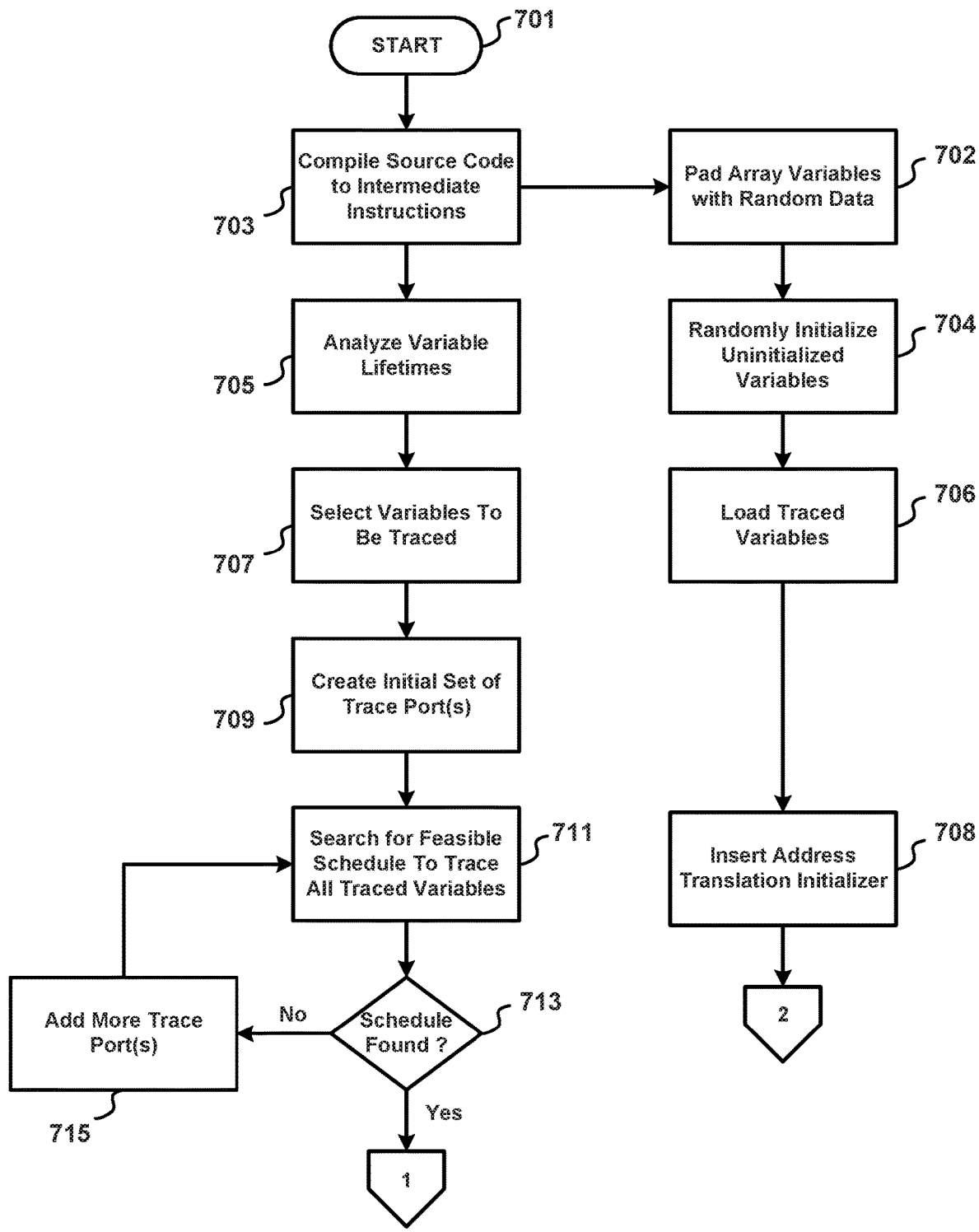
FIGS. 7, 8, and 9 shows a schematic flow chart of a QED-H method according to an aspect of the present disclosure.

With reference to that FIG. 6, we note that certain transfers are initiated by read operations and others are initiated by write operations—as indicated. Additionally, solid lines correspond to a first pass operation while dotted lines correspond to a second pass operation.

In a first pass, reads and writes go directly to memory as usual, with one exception: to satisfy TR-QH (1), memory locations that are loaded and then stored in a region need to be saved before the store occurs (i.e., to prevent WAR hazards), These saved values are inserted into the QED-H cache, either opportunistically when the load before store occurs (as determined by address alias analysis), or by issuing a simultaneous read of the old value when the store after load occurs (FIG. 6). In the second execution pass we load the original value of an overwritten memory location (overwritten by the first pass) from the QED-H cache. When a second pass write is issued, we load the memory location instead and compare the loaded value with the data to be written, satisfying TR-QH (2). Simultaneously, we tell the cache to evict the QED-II cache entry for that location so that from the point of view of subsequent load instructions the write has taken effect.

While the QED-H cache satisfies the TR-QH requirements, it doesn't address the silent memory corruption problem. Avoiding duplicating memory while still being able to perform PLC is an interesting problem. One solution involves partitioning the memory and maintaining a signature (e.g. XOR of all the data values) for each partition. For each memory write, the old value would be XORed out and the new value XORed in. Further complicating matters is that some accelerator designs involve heterogeneous sets of memory blocks with different word sizes and byte masking capability, creating a partitioning challenge.

Accelerating Latency and Coverage Evaluation through FPGA Emulation

Evaluating the coverage of an error detection method involves randomly sampling the (appropriately modeled) error injection space with enough samples to establish high precision as to where the coverage and detection latency actually are. This can involve hundreds or thousands of error injection tests, which can take days if done through simulation. Thus to speed up the evaluation of QED-H, we developed an automated evaluation framework that synthesizes the circuit from C source, applies QED-H transforms, and emulates the circuit and error injection on an FPGA. To enable error injection, we perform error injection enabling transforms. The transform produces a netlist enabled for multiple randomly selection error injections that is then applied to a commercially available system (Altera's Quartus) with a test driver that uses Altera's source-probe megafunction to talk with the host system. The test driver uses a handshake protocol with the host system that enables each test to be run in rapid succession without reprogramming. For example, 10,000 tests of the MEG benchmark circuit, each of which involves over a million execution cycles, can be run in about an hour on our FPGA emulation platform.

FIGS. 7-10 show in flow chart form steps describing method(s) according to the present disclosure. As may be observed from this series of Figures, a number of the steps may advantageously proceed in parallel according to an aspect of the present disclosure when implemented on a digital computer or other programmable device such as that shown schematically in FIG. 11. More particularly, it is noted that the even numbered block identifiers and odd numbered block identifiers may proceed in parallel when so implemented.

With simultaneous reference to FIGS. 7-10, it is noted that an exemplary process according to the present disclosure begins at block 701 and proceeds to block 703 wherein source code is compiled to intermediate instructions. Following, variable lifetimes are analyzed at block 703, variables to be traced are selected at block 707, an initial set of trace ports is created at block 709, and a search for feasible schedule to trace all traced variables is made at block 711. If such schedule is found at block 713, then control is directed off sheet to #1, else more trace ports are added at block 715 and control is returned to block 711.

In parallel with the operation of blocks 703-715, at block 702 a set of array variables are padded with random data. Unitialized variables are randomly initialized at block 704 and trace variables are loaded at block 706. An address translation initialize is inserted at block 708 and control is directed off sheet to #2.

Figure 8:
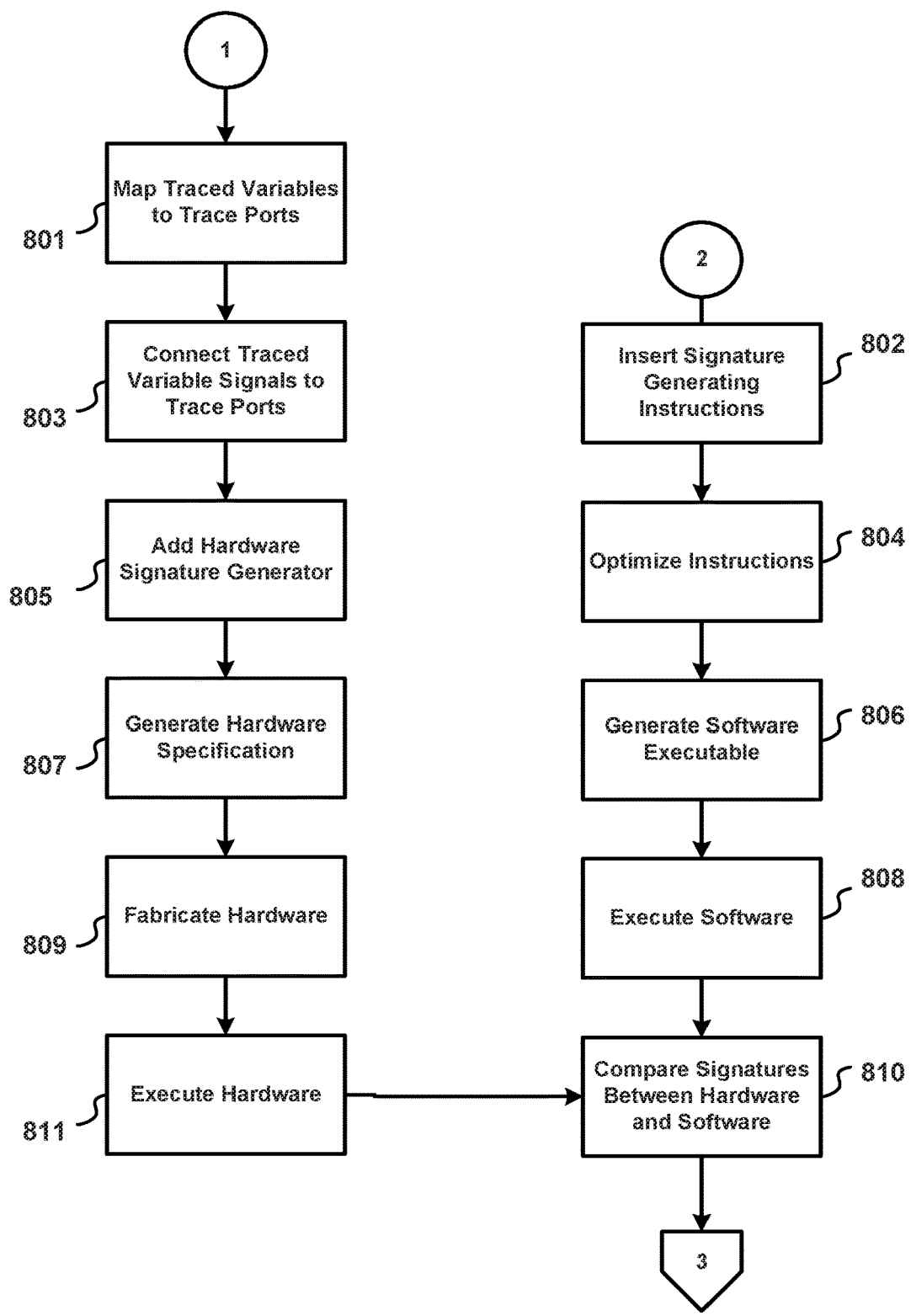

Continuing with our discussion of the overall process with reference to FIG. 8, it is observed that #1 and #2 both proceed in parallel. #1 begins at block 801 by mapping traced variables to trace ports, then connecting traced variable signals to trace ports at block 803. A hardware signature generator is added at block 805 and a hardware specification is generated at block 807. Hardware is fabricated at block 809 and then executed at block 811.

With respect to #2 of FIG. 8, signature generating instructions are inserted at block 802, instructions are optimized at block 804, software executable is generated at block 806 and then executed at block 808.

A comparison is made between hardware and software signatures generated at blocks 811 (hardware) and 808 (software) at block 810 and control is directed off sheet to #3.

Figure 9:
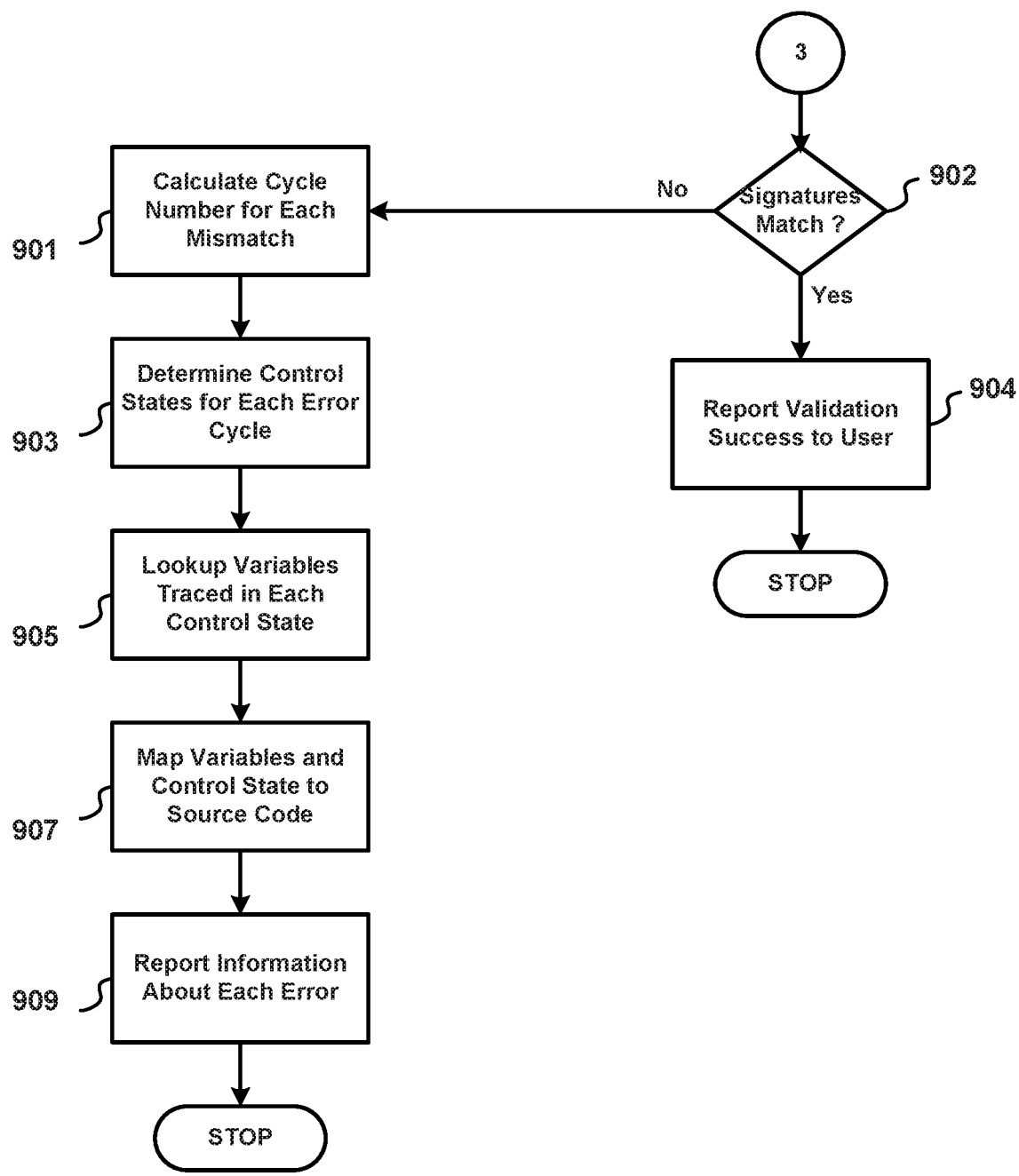

With respect to #3 of FIG. 9, if the signatures match at block 902 then validation success is reported to user at block 904. In the event that the signatures do not match at block 902, then the cycle number for each mismatch is determined at block 901, control states for each error cycle are determined at block 903, variables traced in each control state are looked-up at block 905, variables and control state are mapped to source code at block 907, and information about each error is reported at block 909.

At this point we note that methods, structures and techniques according to the present disclosure will work for the pre-silicon verification even when inputs are RTL code written in languages such as Verilog code. In such a case, the comparing signatures between a hardware path and a software path is not completely applicable. More specifically, when RTL is the inputs, the two paths are both describing the same hardware functionality however the two paths may have different execution orders and different resources utilized. Importantly, the two paths originate from the same RTL code.

Figure 10:
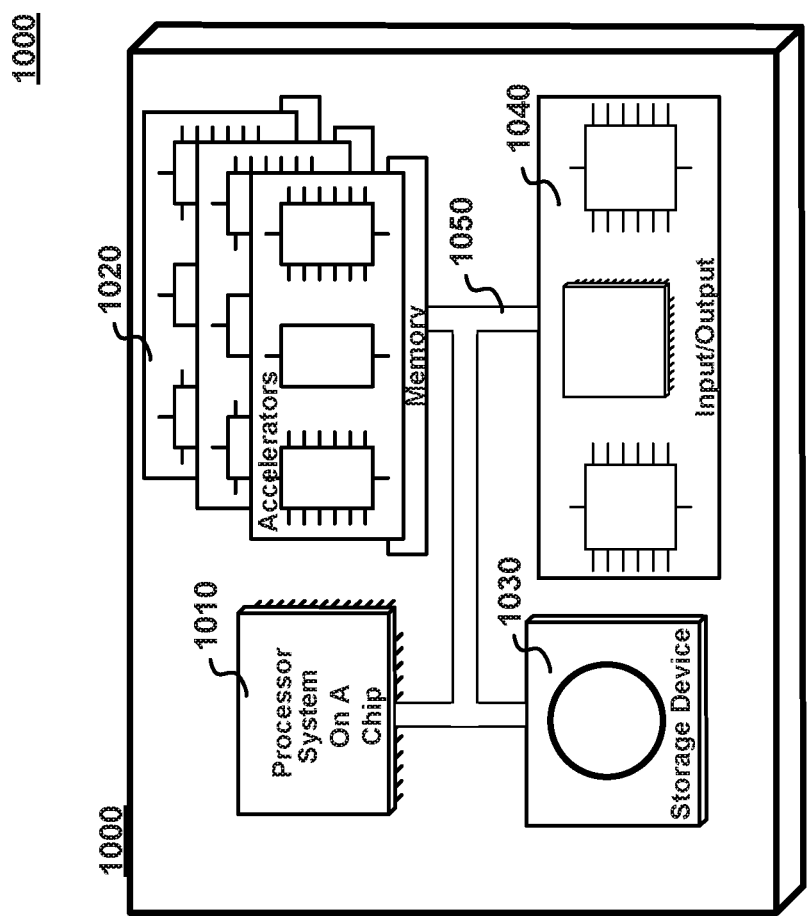
FIG. 10 shows a block diagram depicting an illustrative computer system for practicing methods according to an aspect of the present disclosure.

FIG. 10 shows an illustrative computer system 1000 suitable for implementing methods and systems according to an aspect of the present disclosure. As may be immediately appreciated, such a computer system may be integrated into an another system such as a router and may be implemented via discrete elements or one or more integrated components. The computer system may comprise, for example a computer running any of a number of operating systems. The above-described methods of the present disclosure may be implemented on the computer system 1000 as stored program control instructions.

Computer system 1000 includes processor 1010, memory 1020, storage device 1030, and input/output structure 1040. One or more input/output devices may include a display 1045. One or more busses 1050 typically interconnect the components, 1010, 1020, 1030, and 1040. Processor 1010 may be a single or multi core. Additionally, the system may include accelerators etc further comprising the system on a chip.

Processor 1010 executes instructions in which embodiments of the present disclosure may comprise steps described in one or more of the Drawing figures. Such instructions may be stored in memory 1020 or storage device 1030. Data and/or information may be received and output using one or more input/output devices.

Memory 1020 may store data and may be a computer-readable medium, such as volatile or non-volatile memory. Storage device 1030 may provide storage for system 1000 including for example, the previously described methods. In various aspects, storage device 1030 may be a flash memory device, a disk drive, an optical disk device, or a tape device employing magnetic, optical, or other recording technologies.

Input/output structures 1040 may provide input/output operations for system 1000.

At this point, those skilled in the art will readily appreciate that while the methods, techniques and structures according to the present disclosure have been described with respect to particular implementations and/or embodiments, those skilled in the art will recognize that the disclosure is not so limited. Accordingly, the scope of the disclosure should only be limited by the claims appended hereto.

The invention claimed is:

1. A computer implemented method for system-level validation of a digital hardware system comprising the steps of:
    generating a high-level description of the digital hardware system;
    embedding into the high level description a number of quick error detection (QED) transformations;
    generating from the high-level description an executable software program representative of operation of the digital system;
    generating the digital hardware system from the high-level description including the QED transformations;
    executing, on a processor, the executable software program wherein upon execution one or more software signatures are generated by
        connecting any non-temporary registers to one or more MUX trees such that no two registers are connected to the same tree when they are written in a same state wherein the number of MUX trees is at least equal to a maximum number of simultaneous non-temporary register writes occurring in the state;
    operating the generated digital hardware system wherein upon operation one or more hardware signatures are generated;
    comparing the software signatures to the hardware signatures; and
    in response to the comparison, providing an output indicative of that comparison.

2. The computer implemented method of claim 1 wherein the digital system is a System on a Chip (SoC).

3. The computer implemented method of claim 2 wherein the execution of the software program and the operation of the digital hardware system are done at different times.

4. The method of claim 1 wherein the transformations are time redundant QED (TR-QED) transformations that modify a state machine of a circuit to re-execute each basic block).

5. The method according to claim 4 wherein the TR-QED transformations are of a type selected from the group consisting of: TR-QH (1) wherein variables representing inputs to a region that are modified in that region are saved and restored for re-execution and TR-QH (2) wherein variables representing outputs of a region are saved in a first pass for comparison with a second pass.

6. The method of claim 5 wherein register transforms for TR-QH include duplicating a register or providing a register having a change detector.

7. The method of claim 2 wherein the executable software program executes on a processor co-located on a same SoC as the digital hardware system, and the digital hardware system is not necessarily software programmable.

8. The method of claim 1 wherein the digital hardware system is a hardware emulation system wherein circuits are emulated on a field programmable gate array (FPGA).

9. The method of claim 1 wherein the software execution is not performed in lock-step with the hardware operation.

10. The method of claim 1 wherein the transformations are Hybrid QED-H transformations (H-QH) wherein an accelerator is automatically generated through a different HLS flow that operates on a specification of the accelerator in a high-level description language and the generated accelerator does not include special hardware components.

\* \* \* \* \*